United States Patent
Buchanan et al.

(10) Patent No.: US 7,746,051 B1
(45) Date of Patent: Jun. 29, 2010

(54) VOLTMETER WITH DUAL DISPLAYS

(75) Inventors: James S. Buchanan, Northbrook, IL (US); William J. McNulty, Washington, DC (US)

(73) Assignee: HD Electric Company, Waukegan, IL (US)

( * ) Notice: Subject to any disclaimer, the term of this patent is extended or adjusted under 35 U.S.C. 154(b) by 0 days.

(21) Appl. No.: 12/372,775

(22) Filed: Feb. 18, 2009

(51) Int. Cl.
*G01R 31/02* (2006.01)
*G01R 19/00* (2006.01)

(52) U.S. Cl. .............. 324/72.5; 324/114; 324/141; 324/149; 324/754; 324/158.1; 702/62

(58) Field of Classification Search .......... 324/72.5, 324/114, 141, 149; 702/61–62; G01R 19/00
See application file for complete search history.

(56) References Cited

U.S. PATENT DOCUMENTS

| | | | |
|---|---|---|---|
| 3,287,642 A * | 11/1966 | Simkins ............... 324/149 |
| 3,392,334 A * | 7/1968 | Bevins ............... 324/149 |
| 4,527,118 A * | 7/1985 | Koslar ............... 324/133 |
| 5,072,174 A | 12/1991 | Weber | |
| 5,136,234 A | 8/1992 | Shaw | |
| 5,640,155 A | 6/1997 | Springer | |
| 6,137,285 A * | 10/2000 | Walsten et al. ............... 324/133 |
| 6,445,175 B1 | 9/2002 | Estep et al. | |
| 6,459,252 B1 * | 10/2002 | Bierer ............... 324/72.5 |
| 6,734,658 B1 * | 5/2004 | Bierer ............... 324/115 |
| 6,998,832 B1 * | 2/2006 | McNulty ............... 324/72.5 |
| 7,304,618 B2 | 12/2007 | Plathe | |
| 2003/0137310 A1 | 7/2003 | Holzel | |

* cited by examiner

*Primary Examiner*—Ha Tran T Nguyen
*Assistant Examiner*—Emily Y Chan
(74) *Attorney, Agent, or Firm*—Seyfarth Shaw LLP

(57) ABSTRACT

A voltmeter/phaser includes dual hot-stick probes, each carrying a housing including a digital display, one of the housings also having a measurement circuit for measuring the sensed voltage. A plural-conductor cable interconnects the housings and carries, in two separate conductors, current between the probes and display data between the display circuits, so that identical voltage values are always displayed on the two displays.

19 Claims, 1 Drawing Sheet

VOLTMETER WITH DUAL DISPLAYS

TECHNICAL FIELD

This invention relates to voltage meters and techniques for displaying the measured voltage value. The invention has particular application to high-voltage circuits, such as power line transmission and distribution circuits, but the principles of the invention may also be applied in low voltage circuits.

BACKGROUND

A number of companies manufacture a variety of voltmeters, including high-voltage meters. The high-voltage meters may be of the type generally called hot-stick voltmeters or hot-stick voltmeters/phasers. They generally incorporate the same basic elements, i.e., two hot-sticks with high-voltage resistors encapsulated therewithin, a connecting cord between the two hot-sticks and a voltage meter display. Although meters of this type generally have the capability and resolution of measuring voltages as low as 10 volts and as high as 100 kV, they are most commonly used to measure voltages in the range of 1 kV to 80 kV and are used most commonly on electric power distribution systems of the type operated by electric utility companies.

The high-voltage resistors are selected for their very high electrical resistance, generally several megohms or more, and their ability to withstand the application of high voltage with voltage ratings up to 50 kV per resistor. These resistors are encapsulated within supporting members, generally cylindrical, and these members are constructed of a material selected for both its ability to withstand the direct application of high voltage and mechanical ruggedness to protect the typically more fragile high-voltage resistors inside. The encapsulating material between the resistors and the supporting members serves to provide additional mechanical protection for the resistors, to provide a thermal path for heat generated by the resistors to the outside world and to ensure that the space surrounding the resistors remains free of any contaminant, such as water, which would reduce their capacity to withstand high voltage. The encapsulating material is generally selected for properties such as ability to withstand high voltage, a wide range of operating temperatures and good thermal conductivity. The tubular supporting members, with the encapsulation for the high-voltage resistors therewithin, are often called "hot-sticks," but they are different from the accessory hot-sticks described below.

The connecting cord between the two encapsulated resistor members carries the current from one resistor to the other and is generally covered with an outer high-voltage insulating material, such as rubber, that can withstand the application of the voltages that the voltmeter/phaser will be used to measure.

Mechanical connections on the ends of the tubular supporting members are used to connect these members to accessory hot-sticks. Hot-sticks are long tubular insulating rods, usually several feet in length, that are used to provide both a handle for the users of the voltmeter/phaser and to provide a safe working distance between the user and the energized high-voltage devices or equipment that the voltmeter/phaser will be contacting. The process of measuring live high voltage circuits includes risks from electrocution and burns and the distance that the hot-sticks provide between energized circuits and the persons performing the testing is one component of the safety procedures used to minimize these risks.

Probes on the ends of the meter hot-sticks are typically simple metal terminals and act as a rugged means of contacting the energized conductors or equipment to be measured and connecting this equipment to the encapsulated high-voltage resistors. These probes generally connect to the ends of the hot-sticks with a simple threaded mechanical and electrical connection and are designed to be easily replaced with other probes of different sizes and shapes for different applications.

In operation, the voltmeter/phaser is used to measure the magnitude of a high voltage by applying the metal probes respectively to two different points in a circuit, such as two conductors on a high-voltage circuit. These two conductors can be two phases of a typical three-phase power distribution circuit or any one phase and ground.

When the voltmeter/phaser contacts both conductors of the high voltage circuit a current flows through the voltmeter/phaser, the magnitude of that current being directly proportional to the applied voltage and determined by the value of the high-voltage resistors encapsulated in the hot-sticks. The value of the resulting current is measured and displayed as an equivalent voltage on a suitable meter display.

The display can be either a traditional electromechanical analog type with a moving needle on a printed scale or it can be an electronic digital display of LED or LCD type. Other types of displays, such as bar graphs, etc., are also possible but not common.

Prior voltmeters/phasors of the type described above have only one voltage meter display. That meter display is generally permanently mounted to one of the two hot-sticks.

Voltmeters/phasers are commonly used by a two person line crew, with each person of the crew holding one of the two sticks. Thus, only one of these two persons can readily see the voltage meter display. Because the display is generally visible to only one of the two crew members, various procedures have been developed for the person holding the stick with the meter to relay to the second person the pertinent voltage information.

SUMMARY OF THE INVENTION

The present invention avoids the disadvantages of prior voltmeters/phasers, while affording additional structural and operating advantages.

An aspect of the invention is the provision of a voltmeter/phaser of the dual-probe type which permits display of the measured voltage at either probe.

Another aspect of the invention is the provision of a voltmeter/phaser of the type set forth, which ensures that displays at both probes will always be the same.

A further aspect of the invention is the provision of a voltmeter/phaser of the type set forth which has a single cable connection between the probes.

In an embodiment of the invention, there is provided a voltmeter/phaser with first and second probes for respectively accessing spaced-part points in a circuit, with a voltage measurement circuit proximate to the first probe. A cable including a first conductor connects the first and second probes to each other and to the measurement circuit. First and second voltage display circuits are respectively associated with the first and second probes, the first display circuit being connected directly to the measurement circuit. The cable includes a second conductor connected between the voltage display circuits for conducting a display data signal from the first display circuit to the second display circuit to ensure that both display circuits display the same voltage value.

In another embodiment of the invention, there is provided a voltmeter/phaser with first and second high-voltage probes for respectively accessing spaced-apart points in a high-voltage circuit, with a high-voltage measurement circuit proximate to one of the probes. A cable connects the first and second probes to each other and to the measurement circuit. First and second high-voltage display circuits are respectively associated with the first and second probes and are coupled to the measurement circuit.

In another embodiment of the invention, there is provided a method of measuring and displaying a voltage between spaced-apart points in a circuit, including electrically contacting the points respectively with first and second probes and providing a plural-conductor cable between the probes. The method further includes conducting a current between the probes through a first conductor of the cable, measuring the current and displaying an equivalent measured voltage value on the first display. A signal representative of the displayed value is conducted through a second conductor of the cable to a remote display at the second probe so that both displays show the same value.

BRIEF DESCRIPTION OF THE DRAWINGS

The invention will be apparent from the description herein and the accompanying drawings, in which like reference characters refer to the same parts throughout the different views.

DETAILED DESCRIPTION

Figure 1:
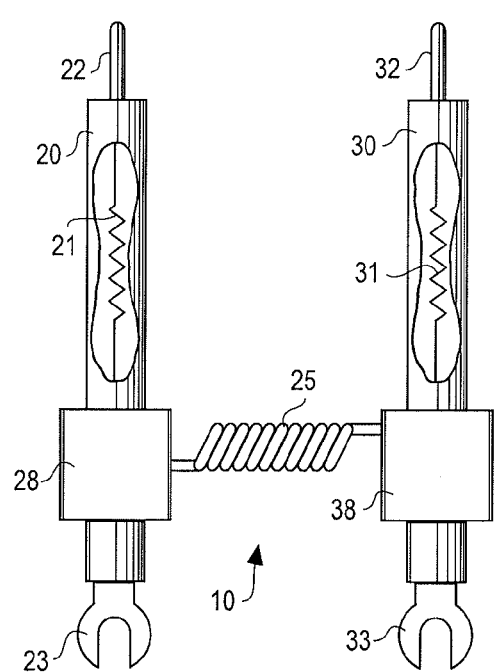
FIG. 1 is a front elevational view of a voltmeter/phaser in accordance with the present invention, with portions broken away to show interior construction.

Referring to FIG. 1, there is illustrated a voltmeter/phaser generally designated by the numeral 10, including two hot-sticks 20, 30, which are of substantially the same construction. The hot-stick 20 and 30 respectively enclose high-voltage resistors 21, 31 which are encapsulated and supported within the hot-sticks 20, 30 by suitable encapsulation material (not shown), and are respectively electrically connected to probes 22, 32 which may be suitably mechanically connected to the hot sticks 20 and 30 in a known manner. The probes 22, 32 are electrically conducting and adapted to make electrical contact with spaced-apart points in the circuit under test. The hot-sticks 20, 30 are respectively provided at their opposite ends with mechanical connections 23, 33 adapted for mechanical connection to extension hot-sticks (not shown) to both extend the reach of the persons using the hot-sticks 20, 30 and provide additional insulation between those users and the circuit under test, all in a known manner. A plural-conductor cable 25 extends between the hot-sticks 20, 30 and includes a current conductor 26 and a data conductor 27 (see FIG. 3). The hot-sticks 20, 30, are respectively provided with housings 28, 38 thereon, the cable 25 being connected between these housings.

Figure 3:
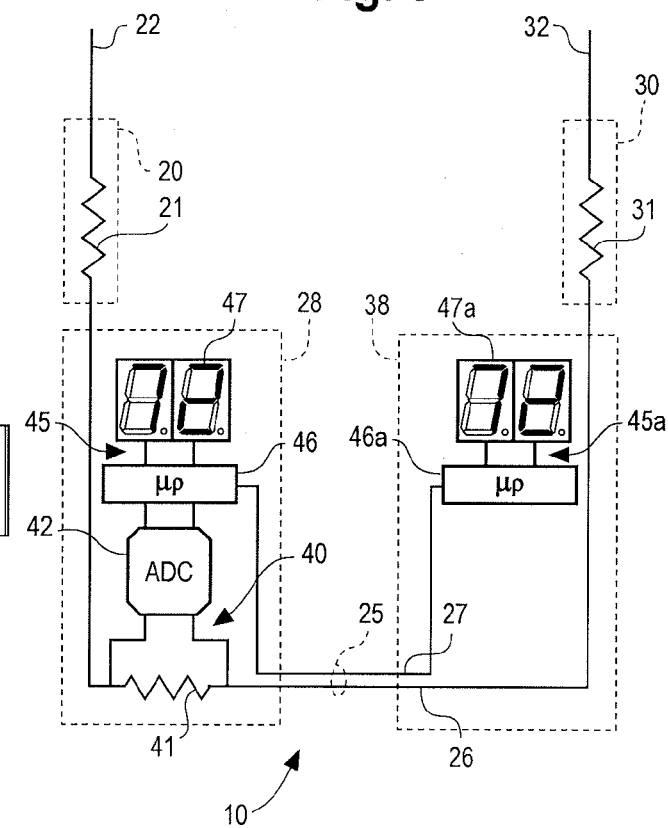
FIG. 3 is a partially schematic and partially functional block diagrammatic view of the circuitry of the voltmeter/phaser of FIG. 1

Referring to FIG. 3, a voltage measurement circuit 40 is mounted in the housing 28 and includes a shunt resistor connected in series between the high-voltage resistors 21 and 31 by the current conductor 26. An analog-to-digital converter ("ADC") 42 is connected across the shunt resistor 41.

Figure 2:
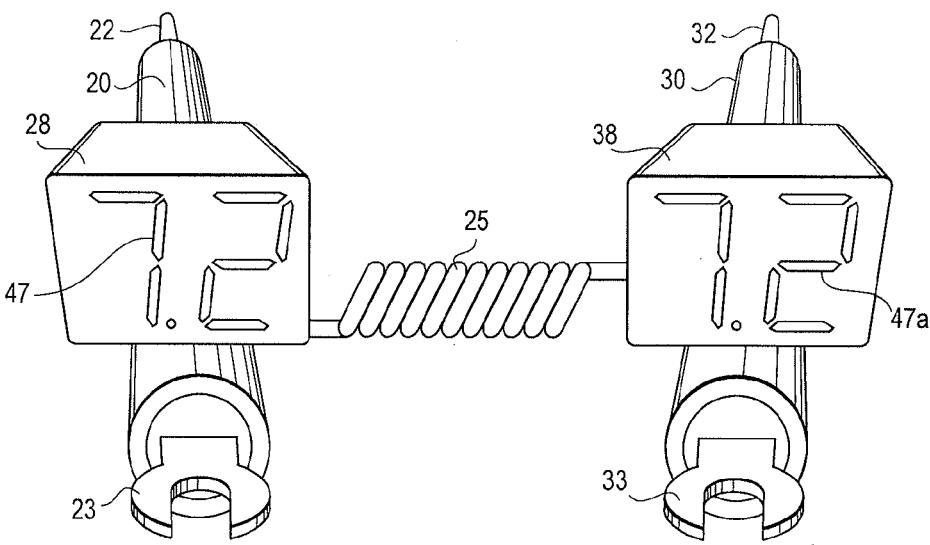
FIG. 2 is an end perspective view of the voltmeter/phaser of FIG. 1 illustrating the digital displays.

Also respectively mounted in the housings 28, 38 are display circuits 45, 45A, respectively including microprocessors 46, 46A which, respectively, drive digital displays 47, 47A (see also FIG. 2). The microprocessor 46 is connected to the output of the ADC 42 and is also connected, via the data conductor 27, to the microprocessor 46A.

When the voltmeter/phaser 10 is in use, the probes 22, 32 will respectively be in direct contact with two high-voltage conductors or one high-voltage conductor and ground. The encapsulated resistors 21, 31 limit the current drawn from the high-voltage circuit to a very low value, typically less than 1 ma. This current flows through the shunt resistor 41, which is a smaller resistor of a value such that the current through it results in only a few volts. Because the shunt resistor is subject to only a few volts, it is not a special high-voltage resistor nor is it encapsulated. In general, any typical low-power resistor will fulfill this function. The low voltage across the shunt resistor 41 is converted to a digital signal by the ADC 42, which sends the resulting digital signal to the microprocessor 46.

The microprocessor 46 performs two functions. First, it converts the digital signal received from the ADC 42 to a form suitable for driving the display digits of the digital display 47, or other suitable display device. Secondly, it sends the digital signal via the data conductor 27 to the microprocessor 46A, which drives the digits of the digital display 47A. The microprocessor 46 may also provide additional functions, such as scaling the voltage reading to provide varying levels of resolution as the magnitude of the voltage changes. For example, an energized conductor with an actual voltage of 7.23 kV can be displayed as simply 7.2 or with an additional digit it could be displayed at the higher resolution of 7.23. The selection of the display resolution can be made automatic with the microprocessor making the decision, based on user preferences or available digits. This function is commonly called autoranging.

The microprocessor 46A receives the digital signal from the microprocessor 46 and converts it to a form to drive the display 47A. In this manner, the voltage signal provides the same voltage value to both displays 47, 47A. Thus, the same number will always appear on both displays nearly simultaneously. While dual microprocessors 46, 46A are illustrated, it would be possible to use a single microprocessor 46. Also, while a particular circuit configuration is illustrated, it will be appreciated that, as with most electronic devices, other circuit topologies could provide the desired functions of measuring, displaying, sending, receiving and redisplaying the voltage reading.

From the foregoing, it can be seen that there has been provided an improved voltmeter/phaser of the dual-probe type, which provides for accurate and identical displays at either probe and provides communication of both display data and current to be sensed over conductors of a single cable of the type which is used to interconnect the hot-sticks of prior dual hot-stick voltmeters.

The invention claimed is:

1. A voltmeter/phaser comprising:
   first and second probes for respectively accessing spaced-apart points in a circuit,
   a voltage measurement circuit proximate to the first probe,
   a cable including a first conductor connecting the first and second probes to each other and to the measurement circuit, and
   first and second voltage display circuits respectively disposed with the first and second probes,
   the first display circuit being connected directly to the measurement circuit,
   the cable including a second conductor connected between the voltage display circuits for conducting a display data signal from the first display circuit to the second display circuit, wherein the measurement circuit is the only measurement circuit to ensure that both display circuits display the same voltage value.

2. The voltmeter/phaser of claim 1, wherein the voltmeter/phaser is adapted for use with high-voltage circuits and further comprises first and second high-voltage resistors respectively connected between the first and second probes and the voltage measurement circuit.

3. The voltmeter/phaser of claim 2, and further comprising insulating hot-sticks respectively enclosing the high-voltage resistors and respectively carrying the first and second probes.

4. The voltmeter/phaser of claim 3, wherein the voltage measurement circuit is mounted on the hot-stick carrying the first probe.

5. The voltmeter/phaser of claim 3, wherein the first and second voltage display circuits are respectively mounted on the first and second hot-sticks.

6. The voltmeter/phaser of claim 5, and further comprising first and second housings respectively enclosing the first and second display circuits.

7. The voltmeter/phaser of claim 6, wherein the voltage measurement circuit is disposed in the first housing.

8. The voltmeter/phaser of claim 7, wherein the cable extends between the first and second housings.

9. The voltmeter/phaser of claim 1, wherein each of the first and second voltage display circuits includes a digital display.

10. The voltmeter/phaser of claim 9, wherein the voltage measurement circuit includes a shunt resistor connected in series with the probes and an analog-to-digital converter connected across the shunt resistor.

11. The voltmeter/phaser of claim 9, wherein the voltage display circuits include a microprocessor circuit.

12. The voltmeter/phaser of claim 11, wherein the microprocessor circuit includes first and second microprocessors respectively associated with the digital displays.

13. The voltmeter/phaser of claim 12, wherein the second conductor is connected between the first and second microprocessors.

14. A voltmeter/phaser comprising:
first and second high-voltage probes for respectively accessing spaced-apart points in a high-voltage circuit,
a high-voltage measurement circuit proximate to one of the probes,
a cable connecting the first and second probes to each other and to the measurement circuit, and
first and second high-voltage display circuits respectively disposed with the first and second probes and coupled to the measurement circuit, wherein the measurement circuit is the only measurement circuit, and the first and second display circuits present identical voltage measures.

15. The voltmeter/phaser of claim 14, wherein the probes and the measurement circuit and the display circuits are adapted for use with voltages in the kilovolt range.

16. The voltmeter/phase of claim 14, and further comprising first and second high-voltage resistors respectively connected between the first and second probes and the voltage measurement circuit, and insulating hot-sticks respectively enclosing the high-voltage resistors and respectively carrying the first and second probes.

17. The voltmeter/phaser of claim 16, wherein the first and second voltage display circuits are respectively mounted on the first and second hot-sticks.

18. A method of measuring and displaying a voltage between spaced-apart points in a circuit comprising:
electrically contacting the points respectively with first and second probes,
providing a plural-conductor cable between first and second the probes,
conducting a current between the first and second probes through a first conductor of the cable, measuring the voltage at one of the probes
measuring the current and displaying an equivalent measured voltage value at a first display disposed with the first probe, and
conducting through a second conductor of the cable a signal representative of the displayed voltage value to a second remote display at the second probe so that both displays show the same value.

19. The method of claim 18, wherein the voltage being measured is in the kilovolt range.

* * * * *

UNITED STATES PATENT AND TRADEMARK OFFICE
CERTIFICATE OF CORRECTION

PATENT NO. : 7,746,051 B1
APPLICATION NO. : 12/372775
DATED : June 29, 2010
INVENTOR(S) : James S. Buchanan and William J. McNulty It is certified that error appears in the above-identified patent and that said Letters Patent is hereby corrected as shown below:

Column 6 line 27 "between first" should be "between the first".

Column 6 line 28 "second the probes" should be "second probes".

Signed and Sealed this

Thirty-first Day of August, 2010

David J. Kappos
*Director of the United States Patent and Trademark Office*